United States Patent
Kim et al.

(10) Patent No.: US 10,221,078 B2
(45) Date of Patent: Mar. 5, 2019

(54) ROOM TEMPERATURE MULTIFERROIC THIN FILMS

(71) Applicant: University of Florida Research Foundation, Inc., Gainesville, FL (US)

(72) Inventors: Kyoung Tae Kim, Gainesville, FL (US); Yong Kyu Yoon, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 15/504,781

(22) PCT Filed: Sep. 2, 2015

(86) PCT No.: PCT/US2015/048113
§ 371 (c)(1),
(2) Date: Feb. 17, 2017

(87) PCT Pub. No.: WO2016/036838
PCT Pub. Date: Mar. 10, 2016

(65) Prior Publication Data
US 2017/0275178 A1    Sep. 28, 2017

Related U.S. Application Data

(60) Provisional application No. 62/080,601, filed on Nov. 17, 2014, provisional application No. 62/045,304, filed on Sep. 3, 2014.

(51) Int. Cl.
*H01L 29/82* (2006.01)
*C01G 23/053* (2006.01)
(Continued)

(52) U.S. Cl.
CPC ......... *C01G 23/053* (2013.01); *C01G 23/003* (2013.01); *H01L 41/318* (2013.01); *C01P 2002/72* (2013.01); *C01P 2004/03* (2013.01)

(58) Field of Classification Search
CPC . C01G 23/053; H01L 41/318; C01P 2002/72; C01P 2004/03
(Continued)

(56) References Cited

U.S. PATENT DOCUMENTS

| 883,108 A | 3/1908 | Gillespie |
| 7,597,817 B1 * | 10/2009 | Li ............... C01G 23/006 252/62.51 R |

(Continued)

OTHER PUBLICATIONS

Srivastava, K. K. P.; Sinha, K. K., "Dielectric studies of polycrystalline (Sr,Fe)TiO3 ceramics", Indian Journal of Pure and Applied Physics (2005),43(11), 884-888.*

(Continued)

*Primary Examiner* — Mohammad M Hoque
(74) *Attorney, Agent, or Firm* — Thomas Horstemeyer, LLP

(57) ABSTRACT

Various examples are provided for multiferroic thin films. In one example, a multiferroic thin film device includes a thin film of multiferroic material and an electrode disposed on a side of the thin film of multiferroic material. The multiferroic material can be $(Fe_x Sr_{1-x})TiO_3$ In another example, a method for producing a multiferroic thin film includes forming a multiferroic precursor; disposing the multiferroic precursor on a substrate to form a multiferroic coating; pre-baking the multiferroic coating on the substrate to form a pre-baked multiferroic thin film; and annealing the pre-baked multiferroic thin film under an oxygen atmosphere to form a crystalized multiferroic thin film. One or more electrodes can be formed on the crystalized multiferroic thin film.

18 Claims, 8 Drawing Sheets

(51) Int. Cl.
*C01G 23/00* (2006.01)
*H01L 41/318* (2013.01)

(58) Field of Classification Search
USPC .......................................................... 257/421
See application file for complete search history.

(56) References Cited

U.S. PATENT DOCUMENTS

| | | |
|---|---|---|
| 8,803,264 B1 | 8/2014 | Katiyar et al. |
| 2012/0292677 A1* | 11/2012 | Dubourdieu ...... H01L 29/42316 257/295 |

OTHER PUBLICATIONS

International Search Report for PCT/US2015/048113 dated Dec. 4, 2015.
Kim, et al., Room temperature multiferroic properties of (Fex,Sr1-x)TiO3 thin films. Applied Physics Letters. vol. 105. Sep. 9, 2014; 5 pages.
Srivastava, et al., Thermal and XRD studies of polycrystalline(Fe,Sr)TiO3 ceramics, Indian Journal of Pure and Applied Physics, vol. 42, 2004, pp. 745-748.
Wang, et al., Preparation and characterization of (Ba1-xSrx)(Ti0.9Sn0.1)O3 thin films deposited on Pt/Ti/SiO2/Si substrate by RF magnetron sputtering. Journal of Crystal Growth, vol. 241, 2002, pp. 439-447.
Thomas, et al., "Multiferroic thin-film integration onto semiconductor devices", Journal of Physics: Condensed Matter, 22, 2010, pp. 1-17.
Tkach, et al., "Structure-microstructure-dielectric tunability relationship in Mn-doped strontium titanate ceramics", Acta Materialia Journals, Science Direct, 53, 2005, pp. 5061-5069.
Şale, et al., "Magnetic properties of Fe implanted SrTiO3 perovskite crystal", Materials Research Bulletin vol. 48, Issue 8, Aug. 2013, pp. 2861-2864.
Şale, et al., "Magnetic resonance and ferromagnetic behaviour in Fe-implanted SrTiO3", Solid State Communications vol. 150, Issues 3-4, Jan. 2010, pp. 219-222.
Chavarha, Misha, "Magnetic Properties and Defects of Iron Implanted Strontium Titanate Single Crystals and Thin Films", Thesis submitted to University of Western Ontario, Jun. 2012.
Kim, et al., "Magnetoelastic effects in SrTi1—xMxO3 (M = Fe, Co, or Cr) epitaxial thin films", Phys. Rev. B 84, 014416, Jul. 2011.
Koehl, et al., "Detection of Fe2+ valence states in Fe doped SrTiO3 epitaxial thin films grown by pulsed laser deposition", Phys. Chem. Chem. Phys., Apr. 2013, 15, 8311.

* cited by examiner

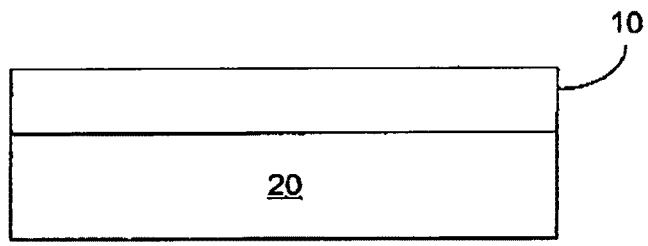
FIG. 1A
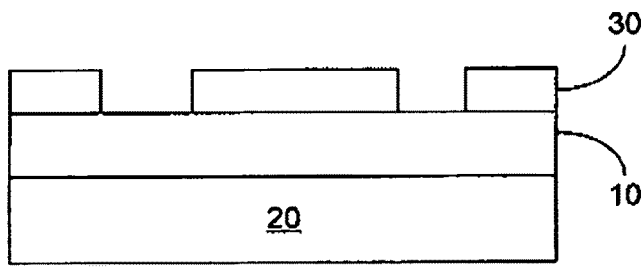
FIG. 1B
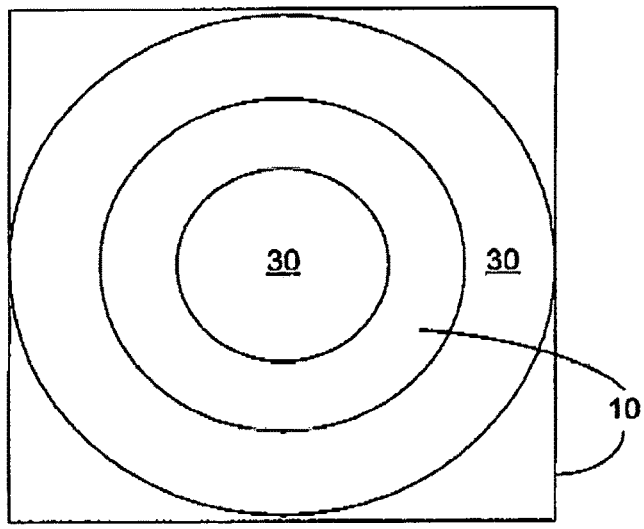

| | Fe content | Grain size (nm) | Lattice Strain (%) | Dielectric constant $\varepsilon_r$ | Dielectric loss tan δ | Dielectric tunability 10 V (%) | FOM | Leakage current density (at 100 kV/cm) (A/cm$^2$) |
|---|---|---|---|---|---|---|---|---|
| STO | 0 | 35 | 0.102 | 195 | 0.024 | 21.2 | 8.8 | $2.37 \times 10^{-7}$ |
| FST | 0.05 | 29 | 0.225 | 180 | 0.022 | 25.3 | 11.3 | $5.71 \times 10^{-7}$ |
| FST | 0.1 | 22 | 0.253 | 149 | 0.021 | 18.6 | 8.9 | $1.2 \times 10^{-6}$ |
| FST | 0.2 | 16 | 0.232 | 118 | 0.018 | 13.2 | 7.3 | $2.91 \times 10^{-4}$ |
| FST | 0.3 | 12 | 0.188 | 71 | 0.016 | 10.1 | 6.3 | $3.74 \times 10^{-4}$ |

FIG. 3

ROOM TEMPERATURE MULTIFERROIC THIN FILMS

CROSS REFERENCE TO RELATED APPLICATIONS

This application is the 35 U.S.C. § 371 national stage application of PCT Application No. PCT/Y/a2015/048113, filed Sep. 2, 2015, which claims priority to, and the benefit of, U.S. provisional applications entitled "Room Temperature Multiferroic Properties of $(Fe_x,Sr_{1-x})TiO_3$ Thin Films" having Ser. No. 62/045,304, filed Sep. 3, 2014, and entitled "Room Temperature Multiferroic Thin Films" having Ser. No. 62/080,601, filed Nov. 17, 2014, all of which are hereby incorporated by reference in their entireties.

BACKGROUND

Multiferroic materials exhibit simultaneous ferroelectricity, ferromagnetism, and/or ferroelasticity with coupled electric, magnetic, and structural order parameters in a single material with the coupling effects among the electric polarization, piezoelectricity and magnetization.

SUMMARY

Embodiments of the present disclosure are related to multiferroic materials that operate at room temperature.

Briefly described, one embodiment, among others, comprises a multiferroic thin film device. The multiferroic thin film device can include a thin film of $(Fe_x,Sr_{1-x})TiO_3$; and an electrode disposed on a first side of the thin film of $(Fe_x,Sr_{1-x})TiO_3$. In one or more aspects, the thin film of $(Fe_y,Sr_{1-x})TiO_3$ can comprise an iron content $(Fe_x)$ of $0<x\leq0.3$. The thin film of $(Fe_x,Sr_{1-x})TiO_3$ can be disposed on a substrate and/or an electrode. The substrate can be a platinum (Pt)/titanium (Ti)/silicon dioxide $(SiO_2)$/silicon (Si) substrate. The electrode can be a top platinum electrode. The electrodes can be plantinum (Pt), titanium (Ti), titanium nitrogen (TiN), ruthenium oxide (RuO), or other appropriate metal or alloy. The multiferroic thin film device can include concentric circular patch electrodes including a second electrode disposed about the electrode on the first side of the thin film of $(Fe_x,Sr_{1-x})TiO_3$. The multiferroic thin film device can include a second electrode disposed on a second side of the thin film of $(Fe_x,Sr_{1-x})TiO_3$. The multiferroic thin film device can be a metal-insulator-metal (MIM) multiferroic capacitor, a tunable microwave device, a spintronic device, a magnetic field sensor, or a multiple state memory device.

Briefly described, another embodiment, among others, comprises a method for producing a multiferroic thin film. The method can include forming a $(Fe_x,Sr_{1-x})TiO_3$ precursor; disposing the $(Fe_x,Sr_{1-x})TiO_3$ precursor on a substrate to form a $(Fe_x,Sr_{1-x})TiO_3$ coating; pre-baking the $(Fe_x,Sr_{1-x})TiO_3$ coating on the substrate to form a pre-baked $(Fe_x,Sr_{1-x})TiO_3$ thin film; and annealing the pre-baked $(Fe_x,Sr_{1-x})TiO_3$ thin film under an oxygen atmosphere to form a crystalized $(Fe_x,Sr_{1-x})TiO_3$ thin film. In one or more aspects, forming the $(Fe_x,Sr_{1-x})TiO_3$ precursor can comprise combining an iron-strontium (Fe,Sr) stock solution with dissolved titanium iso-propoxide. The (Fe,Sr) stock solution can comprise a mixture of strontium acetate and iron acetate solutions. The $(Fe_x,Sr_{1-x})TiO_3$ precursor can be disposed on the substrate by spin-coating or by direct sputtering. In one or more aspects, the method can include forming an electrode, or a plurality of electrodes, on the crystalized $(Fe_x,Sr_{1-x})TiO_3$ thin film. The electrode can be formed by sputter-depositing platinum (Pt) on the crystalized $(Fe_x,Sr_{1-x})TiO_3$ thin film using a photolithography lift-off process. In some embodiments, the $(Fe_x,Sr_{1-x})TiO_3$ precursor can be disposed on the substrate and an electrode to form the $(Fe_x,Sr_{1-x})TiO_3$ thin film. The substrate can be a $Pt/Ti/SiO_2/Si$ (platinum/titanium/silicon dioxide/silicon) substrate. The substrate can comprise sapphire, MgO (magnesium oxide), or La (lanthanum) doped $Al_2O_3$ (aluminum oxide).

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1A and 1B graphically illustrate an example of the fabrication of a multiferroic thin film device in accordance with various embodiments of the present disclosure.

FIG. 3 is a table summarizing various properties of pure STO and examples of FST films characterized at 1 GHz in accordance with various embodiments of the present disclosure.

DETAILED DESCRIPTION

Figure 2:
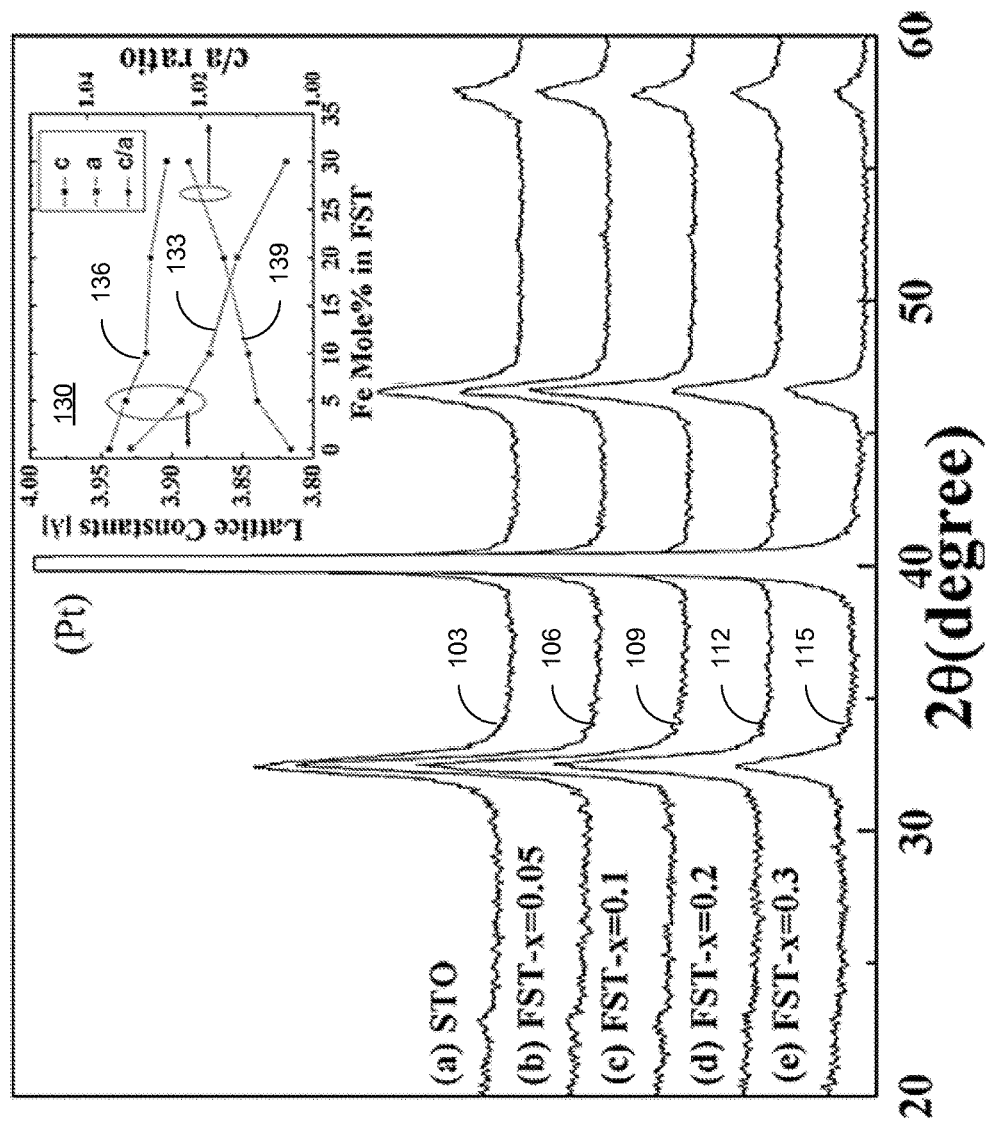
FIG. 2 illustrates examples of XRD θ-2θ patterns of pure $SrTiO_3$ (or STO) and $(Fe_x,Sr_{1-x})TiO_3$ (or FST) thin films in accordance with various embodiments of the present disclosure.

Disclosed herein are various examples related to multiferroic thin films. The structural, dielectric, ferroelectric, and magnetic properties of Fe substituted $SrTiO_3$ thin films at room temperature are examined. Reference will now be made in detail to the description of the embodiments as illustrated in the drawings, wherein like reference numbers indicate like parts throughout the several views.

There are growing interests in the next generation multiferroic thin films for tunable microwave devices, spintronic devices, magnetic field sensors, and multiple state memory devices. Multiferroic materials include perovskite $ABO_3$-type structures, where A or B ions are cationic and the anion O is replaced by formate, which have been broadly studied.

ABO$_3$-type perovskite oxides exhibit sequential structure phase transition. For example, a ferroelectric phase transition, which arises below the Curie temperature $T_c$, exhibits ferroelectricity by the off-centering of the B ions with respect to a centrosymmetric cubic perovskite structure. The fact that off-centering of the B cationic ion (e.g., Ti$^{4+}$; or generally transition metals) originates from its empty d$^0$ electronic state, contradicts the magnetism that arises from local magnetic moments involved in the occupation of the d-state of the B ion. Hence, few single phase mutiferroics of ABO$_3$ perovskite structure at room temperature have been reported due to such a chemical contradicting origination between ferroelectricity and magnetism. The conflicting requirements suggest that an alternative mechanism for magnetism or for ferroelectricity is needed for re-orders to coexist in a single phase.

Magnetism has been exhibited at the A-site of EuTiO$_3$, where magnetic (electric) phase control was achieved by an applied electric (magnetic) field. Lone pair stereochemical activities, such as the spontaneous electric polarization due to the displacement 6 s$^2$ lone pairs in BiFeO$_3$ (antiferromagnetic (AFM) below 643 K) and BiMnO$_3$ (ferromagnetic (FM) below 110K), have also been shown at the A-site. In some geometric ferroelectric materials (e.g., BaNiF$_4$ or hexagonal YMO$_3$), ferroelectricity arises from the rotational instability of the polyhedral and the displacement of the A-site cations.

SrTiO$_3$ (or STO) is an incipient ferroelectric material with a perovskite structure that has a general ABO$_3$ type structure. A and B are cations of different sizes, with the 6-fold coordinate B cation in the middle and the 12-fold coordinate A cation in the corner, and the anion (commonly oxygen) in the center of the face. The A and O ions are thought to form a closely-packed array. STO is a wide band-gap, diamagnetic and quantum paraelectric insulator. Pure STO is a potential ferroelectric material in which the ferroelectric transition is suppressed by quantum fluctuation. STO shows a quantum transition from a classical to a quantum paraelectric state at 37 K. As the temperature continuously increases, the STO phase transitions from tetragonal symmetry (point group, 4/mmm) to cubic (point group, m3m) at the Curie temperature ($T_c$) of 105 K, which is associated with the rotation of the TiO$_6$ octahedral around one of the cubic axes.

In general, the term of element substitution implies that cations in a perovskite structure are partially replaced by other cations with similar ionic radii and the same chemical valence as those of the replaced ions. The partially substituted cations usually occupy the position of the replaced cations in the perovskite structure, resulting in a substitution solid solution being formed. Experimental results indicate that $T_c$ can be slightly reduced or enhanced after the substitution. However, when the amount of element substitution exceeds certain limits, the ferroelectric properties can be degenerated. Substitution of the A-site with a transition metal ion (e.g., magnetic Fe$^{2+}$) can support a local magnetic moment in the STO perovskite structure, while the ferroelectricity appears due to the 3 d$^0$ state of Ti$^{4+}$ at the B-site.

Experimental results have also indicated that multiferroic properties arise from A-site substitution rather than B-site substation. For example, Mn substitution at the Ti site of STO sustains a paraelectric phase as STO, while Mn substitution at the Sr site exhibits multiferroic properties due to coexisting polar and magnetic glass states as well as magnetoelectric coupling. By using different cations for substitution, a magnetic transition metal ion can be rendered in a position of either an A-site or B-site of the STO. Different deposition methods may result in different structures. For example, after Fe implantation on STO, Fe$^{4+}$ substitution on a B-site is possible and the resultant material still shows ferroelectric properties but very little cross coupling electromagnetic effects and multiferroic properties.

In the present disclosure, A-site substitution of Fe$^{2+}$ magnetic ions in an STO perovskite structure is demonstrated using a stoichiometically controlled sol-gel process. As the ionic radius of Fe$^{2+}$ ($r_{12}^{2+}$=1.21 Å) on an A-site is very close to that of Sr$^{2+}$ ($r_{12}^{2+}$=1.24 Å), Fe$^{2+}$ can occupy the A site. The resultant material also shows magnetic properties. The structural, dielectric, and mutiferroics properties of the substituted STO structure at room temperature may be characterized. Structural data obtained from x-ray diffraction indicates that (Fe$_x$Sr$_{1-x}$)TiO$_3$, also called FST, transforms from pseudocubic structures to tetragonal structures as the Fe content in the SrTiO$_3$ thin films increases, featuring the ferroelectricity, while vibrating sample magnetometer measurements show magnetic hysteresis loops for the samples with low iron contents, indicating their ferromagnetism. The characterized ferroelectricity and ferromagnetism confirms strong multiferroitism of the single phase FST thin films at room temperature.

Thin films of (Fe$_x$Sr$_{1-x}$)TiO$_3$ (with x=0, 0.05, 0.1, 0.2, and 0.3) were prepared using iron acetate trihydrate, strontium acetate, and titanium iso-propoxide as the starting materials, and acetic acid and 2-methoxyethol as the solvent for the sol-gel method. Initially, the solid-state strontium acetate and iron acetate were dissolved in the acetic acid. These solutions were then mixed by stirring for 12 hours to obtain an (Fe,Sr) stock solution. Subsequently, the titanium iso-propoxide was dissolved and stirred using a magnetic stirring bar in 2-methoxyethanol under the N$_2$ atmosphere for 12 hours. Finally, the starting solutions were mixed together to prepare the desired stoichiometric, transparent, and stable FST precursor. The mixture of the two starting solutions was stirred for 24 hours at room temperature. The concentration of the FST precursor was adjusted by 0.1 Mol %.

To fabricate FST thin films, the FST precursor solution 10 was syringed through a 0.2 μm acrodisc syringe filter (e.g., Gelman Science, Ann Arbor, Mich., USA), on a Pt(120 nm)/Ti(30 nm)/SiO$_2$/Si (platinum/titanium/silicon dioxide/silicon) substrate 20 as illustrated in FIG. 1A. Other substrates such as, but not limited to, sapphire, MgO (magnesium oxide), and La (lanthanum) doped Al$_2$O$_3$ (aluminum oxide) can also be used. The films were deposited using a spin-coating method at 4000 rpm for 30 seconds onto the Pt(120 nm)/Ti(30 nm)/SiO$_2$/Si substrate and subsequent backing. In other implementations, the FST film can be deposited on the substrate by directly sputtering a stochiometrically composed sputtering target having the desired film composition (e.g., Fe$_{0.05}$Sr$_{0.95}$TiO$_3$ or Fe$_{0.1}$Sr$_{0.9}$TiO$_3$). After the spin-coating procedure, the sample was pre-baked on a hot plate at 150° C. for 10 minutes and then at 350° C. for 30 minutes to remove the organic materials. The pre-baked films were annealed at 700° C. for 2 hours under an oxygen atmosphere for crystallization. Other annealing temperatures such as, but not limited to, 600° C., 650° C., 700° C., 750° C., 800° C. can also be used. The final thickness of the FST films was measured at approximately 260 nm using a scanning electron microscope (SEM).

FST thin film metal-insulator-metal (MIM) multiferroic capacitors were fabricated and characterized in microwave frequencies between 10 MHz and 5 GHz. To examine the ferroelectric and leakage current properties of the FST thin films, top platinum (Pt) electrodes 30 (FIG. 1B) with a thickness of 150 nm and a diameter of 100 μm were sputter-deposited on the FST thin films using a photolithography lift-off process to form the MIM capacitors. In some implementations, one or more electrodes can be formed on or in the substrate, and the FST thin film formed on the substrate and electrode(s). A MIM capacitor based on $Fe_{0.1}Sr_{0.9}TiO_3$ with a thickness of 260 nm showed a high electric tunability of 18.6% at 10 V and a maximum magnetodielectic value of 1.37% at 0.4 mT with a loss tangent of 0.021 at 1 GHz. This high tuning and low loss makes this material as a good candidate for frequency agile microwave applications such as tunable filters, phase shifters, metamaterials, and antennas. Other capacitors can include a gap capacitor such as interdigitated capacitor on a substrate of sapphire, MgO, or La doped $Al_2O_3$, etc.

Cascaded multiple inductor and capacitor (LC) structures can be implemented for a low pass, high pass, band pass, band stop filter using various architectures such as Butterworth or Chebyshev filters. By replacing the capacitors with FST based capacitors a tunable filter can be realized, where variation in the bias voltage can change the capacitance values and thus the center frequency and/or bandwidth of the filter. A transmission line such as, e.g., a stripline, a microstrip, and/or a coplanar waveguide (CPW) can be loaded with the FST based capacitors between the signal and ground lines, where adjusting the bias voltage can change the electrical permittivity and/or magnetic permeability of the media between the signal and ground line, resulting in a phase delay of the transmission line for a phase shifter. For instance, the magnetic permeability of this FST film can be altered via the bias voltage, which incurs a much lower power loss when compared with a conventional current driven permeability changing phase shifter. Also, tunable metamaterials can be realized with the FST thin film. For example, the capacitor components of a composite right/left handed (CRLH) transmission line can be replaced by a FST based capacitor. Split-ring-resonator (SRR) type metamaterials can also be implemented using the FST capacitors. Together with multiple phase shifters and metamaterials, array antennas can be implemented for compact, broadband, beam forming and radar applications.

The low frequency ferroelectric properties and leakage current density of the FST films were measured using a precision workstation ferroelectric tester (e.g., Radiant Technologies Inc., USA) and a semiconductor parameter analyzer (e.g., HP 4146C, HP Inc., USA) with a step voltage of 0.1 V and a delay time of 1 second. To study the dielectric constant and the dielectric loss of the fabricated capacitor in microwave frequencies, concentric circular patch Pt electrodes (e.g., 30 in FIG. 1B) with a center patch diameter of 40 μm were patterned on the thin film FST surface using UV lithography and DC sputtering, followed by the lift-off process. Dielectric properties were characterized using a vector network analyzer (e.g., ENA-E5071C, Agilent, Inc.) with a ground-signal-ground coplanar probe (e.g., 40 A-GSG-150-P, GSG industries, Inc.) and magnetic measurements were performed with a vibrating sample magnetometer (e.g., VSM, EV9 ADE Technologies, Inc.). X-ray diffraction (XRD) profiles were obtained using a diffractometer with a $CuK_\alpha$ radiation source at 45 kV and 40 mA (e.g., X'Pert MRD, Philips Inc.) to determine the phase formation, the sample crystallinity, and the lattice parameters of the FST thin films and microstructural examination was carried out using a SEM (e.g., FEI XL 40 FEG, Philips Inc.).

Referring to FIG. 2, shown are examples of XRD θ-2θ patterns of pure STO (curve 103) and FST thin films as a function of Fe content x (curves 106, 109, 112 and 115) annealed at 700° C. All the STO and FST thin films possess a nontextured polycrystalline structure without any preferred orientation and with no evidence of the secondary phase formation such as ilmenite FeTiO3. Also, a comparison of the diffraction peaks of the FST thin films and those of pure STO does not indicate that the $Fe^{2+}$-substitution affects the perovskite structure of the $SrTiO_3$ (such as forming a pyrochlore phase), but $Fe^{2+}$ appears to have dissolved into the perovskite structure. This implies that the $Fe^{2+}$ ions readily substitute for the $Sr^{2+}$ ions in the $ABO_3$ perovskite structure of STO. FIG. 2 also shows that the reflection shifts to a higher angle with increasing Fe content, which indicates that the dimension of the unit FST lattice is shrinking. This may be attributed to the fact that the ionic radius of $Fe^{2+}$ ($r_{12}^{2+}$=1.21 Å) is similar to, but a bit smaller than that of $Sr^{2+}$ ($r_{12}^{2+}$=1.24 Å), where the $Fe^{2+}$ ionic radius can be obtained from the extrapolated 12 fold coordination curve. In addition, the peak intensity decreases and the full width at half maximum (FWHM) of the peak increases with increasing Fe content x in the STO, which would result from a decrease in the grain size with increasing Fe content. Referring to the table in FIG. 3, shown is a listing of the grain sizes of pure STO and FST with different Fe contents, as measured using a SEM. The grain size changes in 35, 29, 22, 16 and 12 nm as the Fe content x changes in zero, 0.05, 0.1, 0.2, and 0.3, respectively.

The inset 130 of FIG. 2 shows plots of curves 133 and 136 for the lattice parameters a and c, respectively, of the pure STO and FST films as a function of the Fe content x. The lattice parameters (a and c) are calculated from the XRD profile of the single phase samples. Increasing Fe content in the STO leads to a decrease of both lattice parameters, following a linear Vegard's law. This decreasing behavior may be attributed to the difference in the ionic size of $Fe^{2+}$ ($r_{12}^{2+}$=1.21 Å) with respect to $Sr^{2+}$ ($r_{12}^{2+}$=1.24 Å). As can be seen in the inset 130, curve 139 of the tetragonality c/a ratio linearly increases as the Fe content x increases from 0.05 to 0.3.

In the $ABO_3$ perovskite structure, the lattice strain is associated with the ionic displacement that gives rise to the ferroelectricity in the structure. Structurally, the phase of the FST thin film changes from a crystal cubic symmetric to a tetragonal structure with the increasing Fe content in the STO. This results in a pseudocubic symmetry with small tetragonal distortion. The magnitude of the lattice strain can be used to evaluate the ferroelectricity of the material. For a ferroelectric material with a tetragonal structure, the increase of the tetragonality associated with the increase of the atomic displacement can enhance the spontaneous polarization. From the ferroelectricity point of view, a higher Fe content can allow a higher ferroelectricity.

The lattice strain of the FST thin films was quantitatively estimated. The FWHM (Δk) of the XRD peak was fitted for each peak with the scattering vector of k=(4π/λ)sin θ, using a double Lorentzian function. The calculated lattice strains are shown in the table of FIG. 3. With increasing Fe content (up to x=0.1), the lattice strain increased resulting in a phase change from a crystal cubic symmetric structure to a tetragonal structure, and inducing more ferroelectricity. A maximum lattice strain of 0.253(%) was observed in the FST thin films with an Fe content of x=0.1. However, for the FST thin films with Fe contents over x=0.1 (e.g., 0.2 and 0.3), the lattice strain decreased, which may be attributed to the smaller grains, nonuniform grains, and the increase of grain boundaries.

Figure 4:
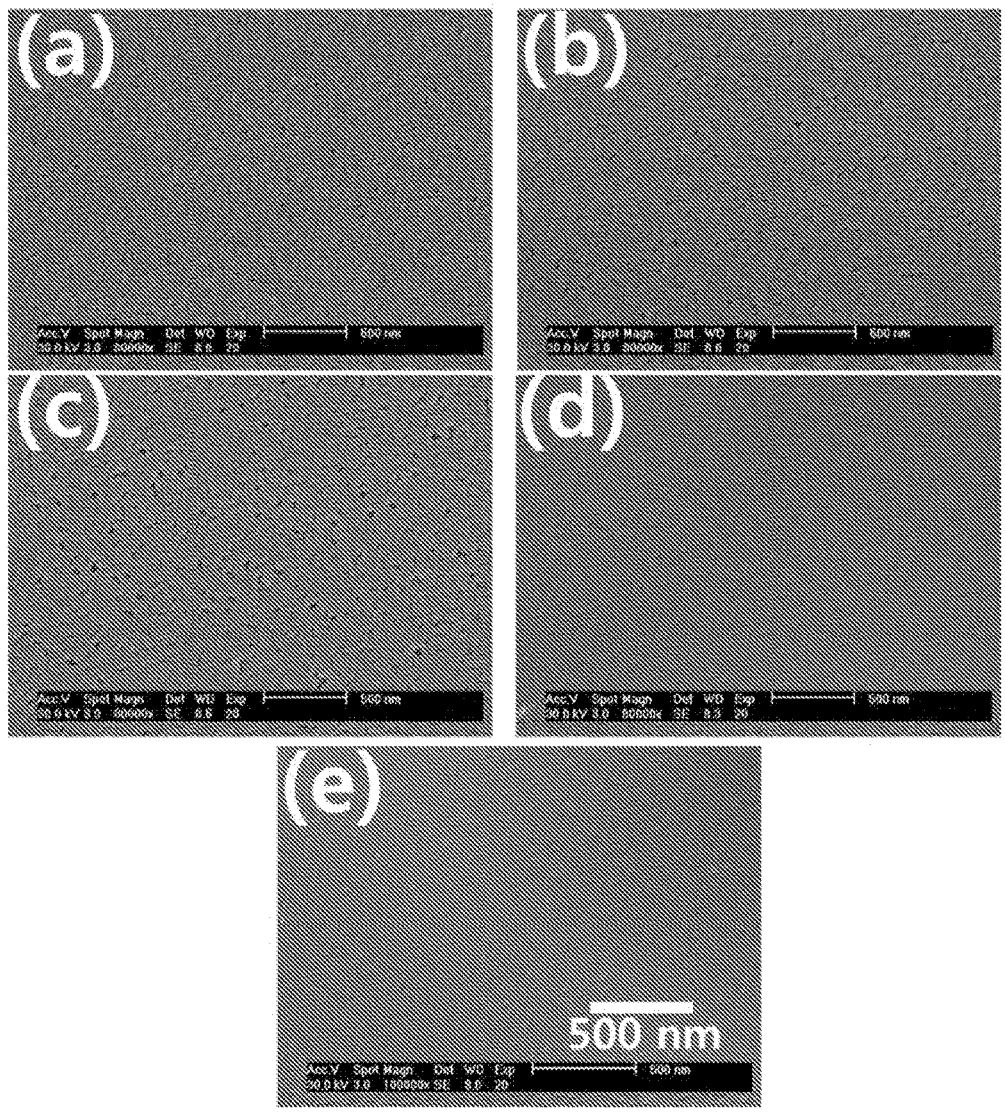
FIG. 4 includes scanning electron microscope (SEM) images of pure STO and examples of FST films in accordance with various embodiments of the present disclosure.

Referring now to FIG. 4, shown are examples of surface SEM morphologies of the pure STO (image a) and the FST thin films annealed at 700° C. as a function of the Fe content with x=0.05 (image b), x=0.1 (image c), x=0.2 (image d) and x=0.3 (image e). As seen in FIG. 4, the surfaces of the FST thin films (images b-e) were smooth and crack free. It should be noted that surface cracks are a result of film stress, which causes dielectric loss and leakage current. The grain size was found to decrease with increasing Fe content, which is consistent with the XRD results where the peak sharpness decreased with increasing Fe content. Specifically, the pure STO and FST thin films with x=0.05 and 0.1 compositions exhibited uniform microstructures with an average grain size of 35, 29 and 22 nm, respectively. The FST thin films with x=0.2 and 0.3 compositions exhibited nonuniform grain structures with an average grain size of 16 and 12 nm, respectively. The nonuniform grain structure may be attributed to an immature film crystallinity, polycrystallinity or multiphase film, and in this case, the films may not have sufficiently crystallized at the annealing temperature and time period applied for that composition. The thin film properties can also be highly influenced by the thickness of the layer and the kind and crystallinity of the underlying layer.

Figure 5:
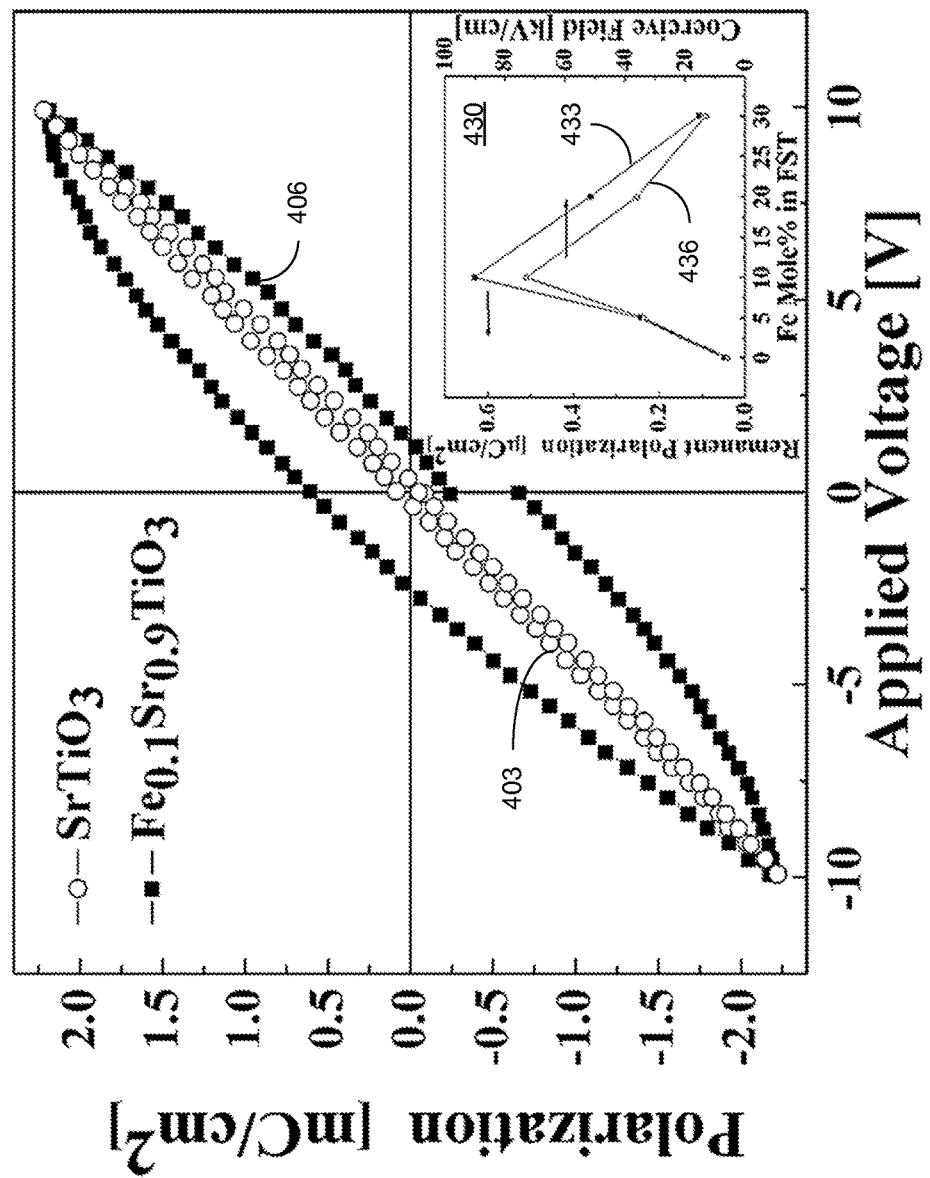
FIG. 5 illustrates examples of polarizationelectric field (P-E) hysteresis curves of pure STO and an example of a FST film in accordance with various embodiments of the present disclosure.

Ferroelectric characteristics have also been analyzed for the STO and FST films. FIG. 5 shows examples of the polarizationelectric field (P-E) hysteresis curves of the pure STO and FST thin films with x=0 (curve 403) and x=0.1 (curve 406), respectively. The pure STO thin film (curve 403) exhibits typical paraelectric behavior with an almost straight line at room temperature. As shown in the inset 430 of FIG. 5, both the remanent polarization (curve 433) and the coercive field (curve 436) increase as the Fe content increases up to x=0.1. This is consistent with the earlier indication that $Fe^{2+}$ ions can readily substitute for $Sr^{2+}$ ions in the $ABO_3$ perovskite structure, making the phase of the FST thin films more tetragonal. However, as the Fe content further increases up to x=0.3, a weak polarization of 0.162 $\mu C/cm^2$ was observed. This indicates that the $(Fe_{0.2}Sr_{0.8})TiO_3$ and $(Fe_{0.3}Sr_{0.7})TiO_3$ thin films were deviating from ferroelectric materials. It was observed that the electrical conductivity of these FST thin films increased at room temperature, resulting in a higher leakage current density and only partial reversal of the polarization occurs. This may be attributed to the variable oxidation states of Fe ions in the crystalline structure and increased boundary effects on the polycrystalline structure. The polarization and coercive field values of the $(Fe_{0.1},Sr_{0.9})TiO_3$ thin film annealed at 700° C. was 0.632 $\mu C/cm^2$ and 72.8 kV/cm, respectively.

Figure 6A:
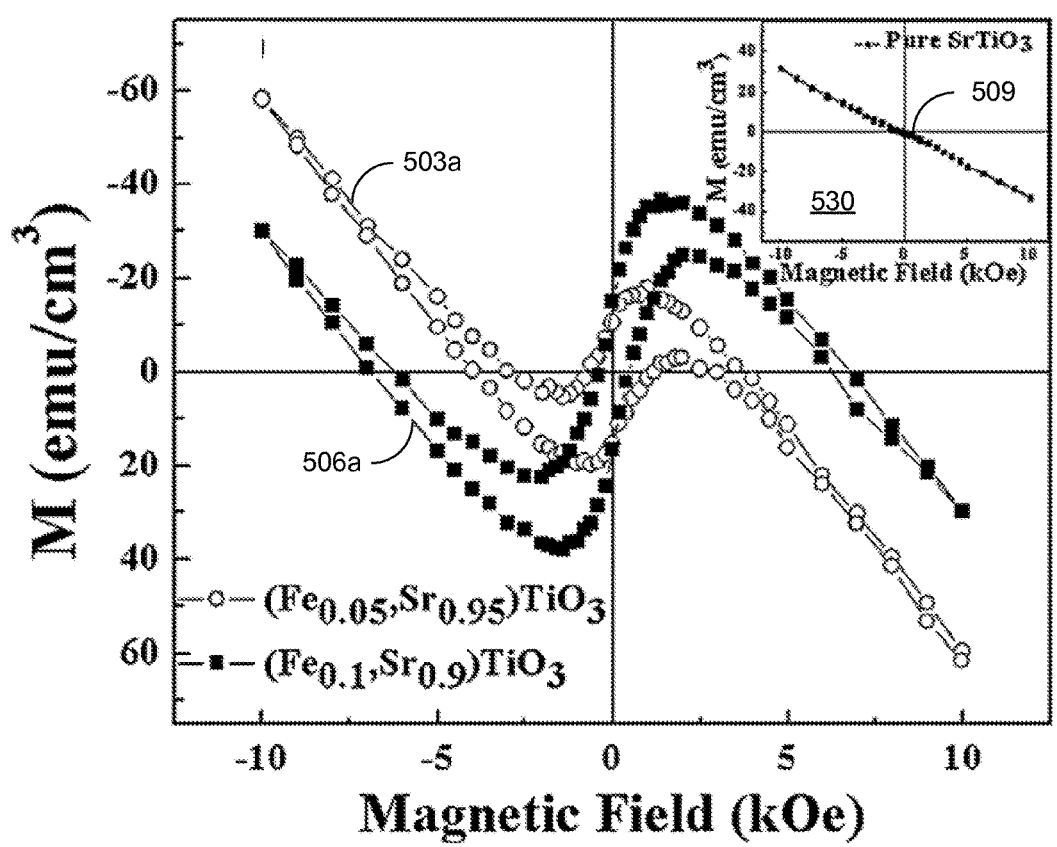
FIGS. 6A and 6B illustrates examples of magnetization hysteresis (M-H) loops at room temperature of pure STO and an example of a FST film in accordance with various embodiments of the present disclosure.
Figure 6B:
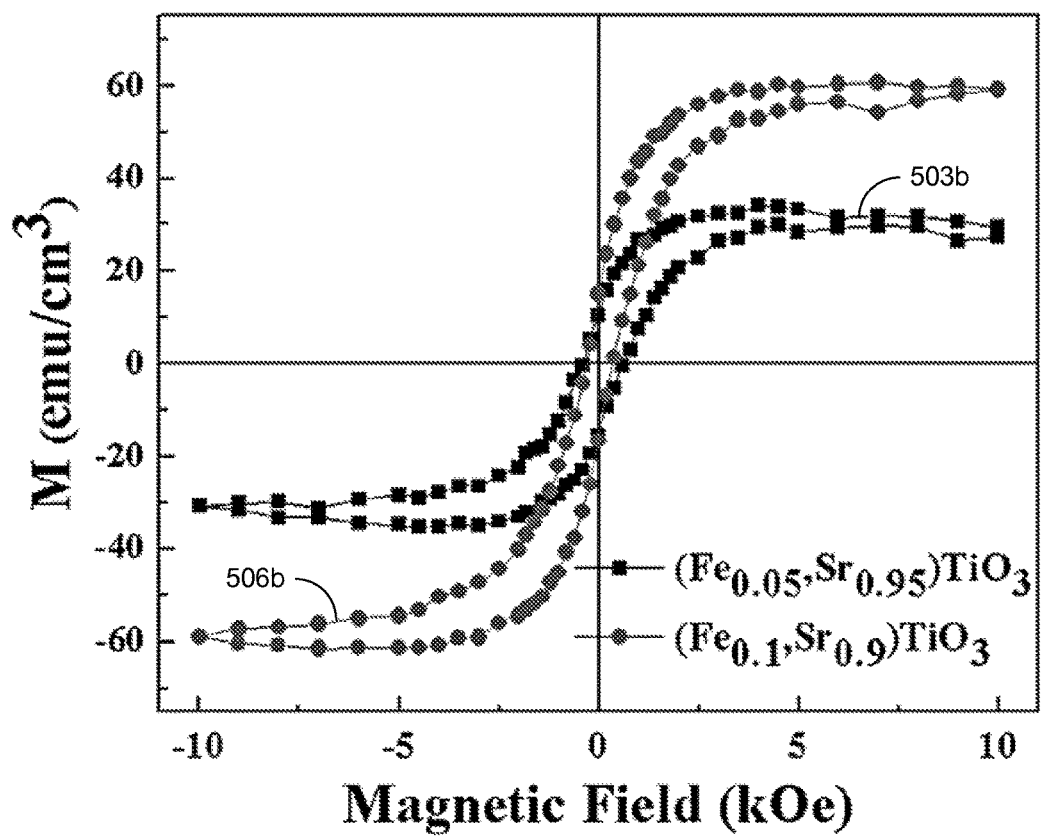

As the FST thin films contain Fe ions, their magnetic properties were also characterized. The magnetization hysteresis (M-H) loops at room temperature for the pure STO and FST thin films with x=0.05 (curves 503) and x=0.1 (curves 506) are shown in FIGS. 6A and 6B. The inset 530 of FIG. 6A shows the magnetization curve 509 of the pure STO thin film, which exhibited a complete diamagnetic behavior over the whole range of the magnetic field. The magnetization curve 509 does not show any magnetic coercivity as expected. Unlike the pure STO thin film, the FST thin films (x=0.05, 0.1) show very remarkable hysteresis loops at room temperature in FIG. 6A. The hysteresis loops 503a and 506a include ferromagnetism which can be attributed to the existence of the Fe ions and diamagnetism inherited from the host STO. After subtracting the diamagnetism portion from curve 509, the pure ferromagnetic M-H loops 503b and 506b can be extracted as shown in FIG. 6B, with the remanent magnetization of the $(Fe_{0.05},Sr_{0.95})TiO_3$ and $(Fe_{0.1},Sr_{0.9})TiO_3$ thin films of $M_r \approx 12.95$ $emu/cm^3$ and $M_r \approx 15.85$ $emu/cm^3$, respectively. The ferromagnetism may originate from the ferromagnetic contributions of the mixed superexchange interactions between different iron oxides ($Fe^{2+}$—O—$Fe^{2+}$, or $Sr^{2+}$—O—$Fe^{2+}$) in the thin film.

Figure 7:
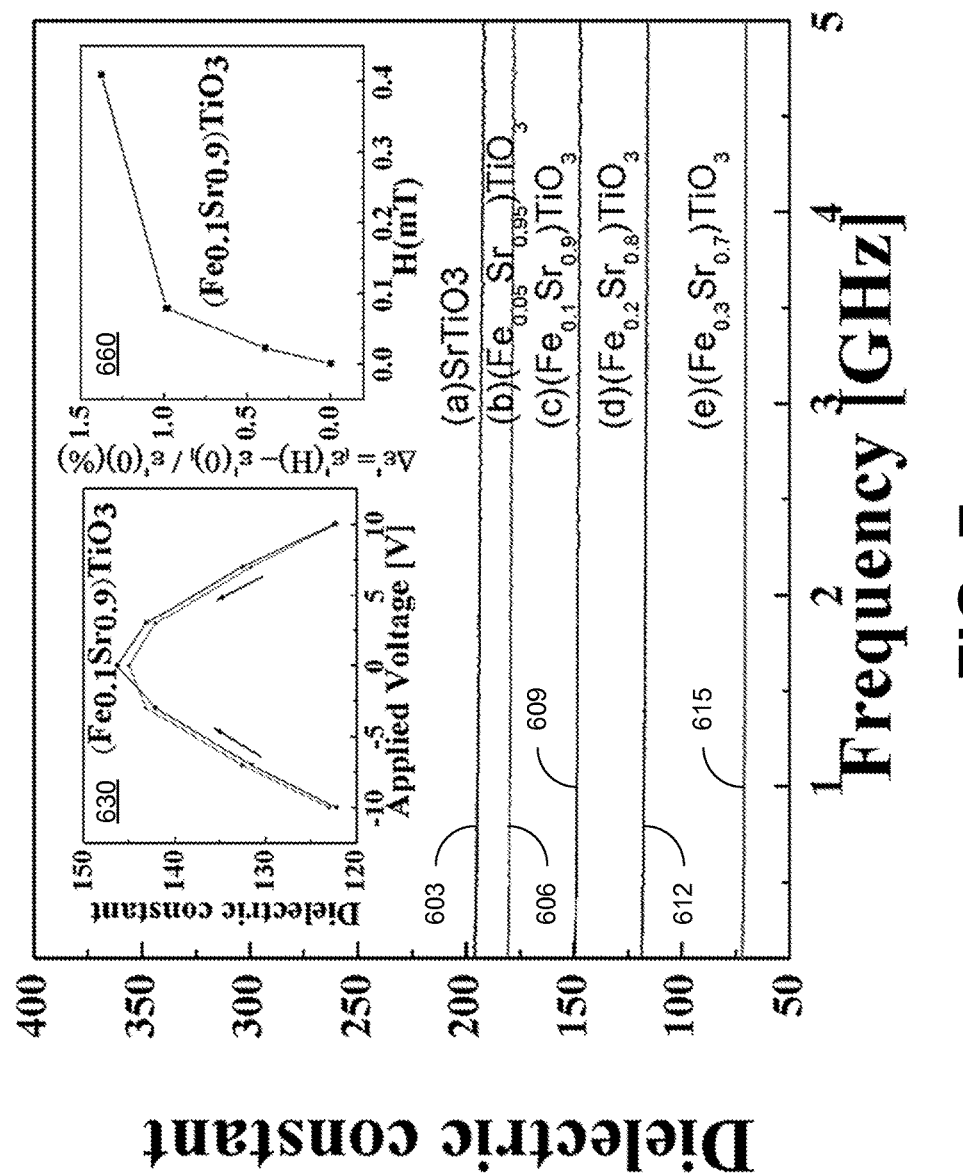
FIG. 7 illustrates examples of dielectric constants of the pure STO and examples of FST films in accordance with various embodiments of the present disclosure.

As the FST thin films have great potential for RF and microwave applications, their dielectric properties were characterized over microwave frequencies. A concentric circular patch capacitor was fabricated to minimize the parasitic effects associated with a conventional rectangular shape coplanar waveguide and background noise. After extracting data from the measured scattering parameters, the electrical permittivity and loss tangent were obtained. Referring to FIG. 7, shown are the dielectric constants of the pure STO (curve 603) and FST thin films with Fe contents of x=0.05 (curve 606), x=0.1 (curve 609), x=0.2 (curve 612) and x=0.3 (curve 615) as a function of frequency. The dielectric properties did not exhibit any appreciable dispersion or resistance over the measured frequency range. This result indicates that the FST films possess good film quality and show the absence of major internal interfacial barriers, which could induce a resonance that would affect the high frequency characteristics. The relative dielectric constant ($\varepsilon_r$) and dielectric loss (tan $\delta$) of the $(Fe_{0.1},Sr_{0.9})TiO_3$ thin film were 149 and 0.021 at 1 GHz, respectively.

The table of FIG. 3 summarizes the grain size, lattice strain, dielectric constant $\varepsilon_r$, dielectric loss tan $\delta$, dielectric tunability, figure of merit (FOM), and leakage current density values for the pure STO and various FST films characterized at 1 GHz. The tunability is defined as $(\varepsilon_{max} - \varepsilon_{min})/\varepsilon_{max}$, where $\varepsilon_{max}$ and $\varepsilon_{min}$ are the maximum and minimum values of the electrical permittivity, respectively, and the maximum and minimum values are obtained at 0 V and 10 V, respectively. FOM is frequently used as a major criterion for microwave tunable devices and is defined as FOM= [tunability/tan $\delta$], where both the tunability and the dielectric loss are used in a percentage scale (%).

Inset 630 of FIG. 7 shows the electrical tunablity of the $(Fe_{0.1},Sr_{0.9})TiO_3$ thin film as a function of the applied voltage. A high tunablity of 18.6% with an applied voltage of 10V was obtained. Coupling between the electric and magnetic dipoles in the $(Fe_{0.1},Sr_{0.9})TiO_3$ thin film was also investigated by measuring the variation in the dielectric constant at 1 GHz as a function of an externally applied magnetic field at room temperature as shown in inset 660 of FIG. 7. The magnetodielectric (MD) effect is defined as $\Delta\varepsilon' = [\varepsilon(H) - \varepsilon'(0)]/\varepsilon'(0)$. Measuring the MD effect was an alternative way of characterizing the degree of the magnetoelectric coupling effect. The dielectric constant increased with the applied magnetic field and the value of the MD effect was found to be 1.37% under a magnetic field of 0.4 mT. The MD effect may originate from the coupling between the ferroelectric domain and magnetism and can be used as a good indicator of multiferroitism.

The FST data of FIG. 3 also show that increasing the Fe content in STO leads to a decrease in grain size, dielectric constant, and dielectric loss, and an increase in leakage current, demonstrating typical polycrystalline properties. It appears that the ferroelectric properties and the magnetic properties becomes significant with $(Fe_{0.05},Sr_{0.95})TiO_3$ and $(Fe_{0.1},Sr_{0.9})TiO_3$, which are attributed to the A-site substitution of $Fe^{2+}$ in STO. However, these effects can be greatly hampered by the polycrystallinity of the FST with higher Fe contents. The annealing temperature of the sol-gel process was fixed at 700° C., which may not be the optimal annealing temperature for the FST with the different Fe contents. Enhanced multiferroic materials with better crystallinity may be achieved using different annealing temperatures and compositions.

The room temperature multiferroic properties of sol-gel based single phase $(Fe_x, Sr_{1-x})TiO_3$ with various Fe contents have been examined and show the viability of using FST thin films in, e.g., tunable microwave devices (e.g., a tunable filter, a phase shifter, a tunable metamaterial, and/or an array antenna module), spintronic devices, magnetic field sensors, and multiple state memory devices (e.g., ferroelectric random access memory (FeRAM), magnetic random access memory (MRAM), and/or memory resistor (Memristor)). The XRD data show that the $(Fe_x,Sr_{1-x})TiO_3$ structure transforms from pseudocubic to tetragonal as the Fe content increases, indicating that the ferroelectricity in a perovskite structure. The high electric tunability, high dielectric constant, low loss, and high magnetodielectric effect of the FST thin films in microwave frequencies at room temperature illustrate their potential for various microwave tunable applications and/or electromagnetic applications.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A muitiferroic thin film device, comprising:
a thin film of $(Fe_x,S_{1-x})TiO_3$ comprising A-site substitution of $Fe^{2+}$ in a $SrTiO_3$ perovskite structure, wherein $0<x\leq 0.3$; and
an electrode disposed on a first side of the thin film of $(Fe_x,S_{1-x})TiO_3$.

2. The multiferroic thin film device of claim 1, wherein the thin film of $(Fe_x,Sr_{1-x})TiO_3$ is disposed on a substrate.

3. The multiferroic thin film device of claim 2, wherein the substrate is a platinum (Pt)/titanium (Ti)/silicon dioxide $(SiO_2)$/silicon (Si) substrate.

4. The multiferroic thin film device of claim 1, wherein the electrode is a top platinum electrode.

5. The multiferroic thin film device of claim 1, comprising concentric circular patch electrodes including a second electrode disposed about the electrode on the first side of the thin film of $(Fe_x,Sr_{1-x})TiO_3$.

6. The multiferroic thin film device of claim 1, comprising a second electrode disposed on a second side of the thin film of $(Fe_x,Sr_{1-x})TiO_3$.

7. The multiferroic thin film device of claim 1, wherein the multiferroic thin film device is a metal-insulator-metal (MIM) multiferroic capacitor.

8. The multiferroic thin film device of claim 1, wherein the multiferroic thin film device is one of a tunable microwave device, a spintronic device, a magnetic field sensor, or a multiple state memory device.

9. A method for producing a muitiferroic thin film device, comprising:
forming a $(Fe_x,S_{1-x})TiO_3$ precursor, wherein $0<x\leq 0.3$;
disposing the $(Fe_x,S_{1-x})TiO_3$ precursor on a substrate to form a $(Fe_x,S_{1-x})TiO_3$ coating;
pre-baking the $(Fe_x,S_{1-x})TiO_3$ coating on the substrate to form a pre-baked $(Fe_x,S_{1-x})TiO_3$ thin film;
annealing the pre-baked $(Fe_x,S_{1-x})TiO_3$ thin film under an oxygen atmosphere to form-a crystalized $(Fe_x,S_{1-x})TiO_3$ thin film comprising A-site substitution of $Fe^{2+}$ in a $SrTiO_3$ perovskite structure; and
forming an electrode on the crystalized $(Fe_x,S_{1-x})TiO_3$ thin film.

10. The method of claim 9, wherein forming the $(Fe_x,Sr_{1-x})TiO_3$ precursor comprises combining an iron-strontium (Fe,Sr) stock solution with dissolved titanium iso-propoxide.

11. The method of claim 10, wherein the (Fe,Sr) stock solution comprises a mixture of strontium acetate and iron acetate solutions.

12. The method of claim 9, wherein the $(Fe_x,Sr_{1-x})TiO_3$ precursor is disposed on the substrate by spin-coating.

13. The method of claim 9, wherein the $(Fe_x,Sr_{1-x})TiO_3$ precursor is disposed on the substrate by direct sputtering.

14. The method of claim 9, wherein the electrode is formed by sputter-depositing platinum (Pt) on the crystalized $(Fe_x,Sr_{1-x})TiO_3$ thin film using a photolithography lift-off process.

15. The method of claim 9, wherein a plurality of electrodes are formed on the crystalized $(Fe_x,Sr_{1-x})TiO_3$ thin film.

16. The method of claim 9, wherein the $(Fe_x,Sr_{1-x})TiO_3$ precursor is disposed on the substrate and an initial electrode to form the $(Fe_x,Sr_{1-x})TiO_3$ thin film on the substrate and the initial electrode.

17. The method of claim 9, wherein the substrate is a $Pt/Ti/SiO_2/Si$ (platinum/titanium/silicon dioxide/silicon) substrate.

18. The method of claim 9, wherein the substrate comprises sapphire, MgO (magnesium oxide), or La (lanthanum) doped $Al_2O_3$ (aluminum oxide).

* * * * *